United States Patent [19]

Blount

[11] 4,019,043

[45] Apr. 19, 1977

[54] PHOTOFLASH LAMP ARRAY HAVING SHIELDED SWITCHING CIRCUIT

[75] Inventor: Richard Blount, South Euclid, Ohio

[73] Assignee: General Electric Company, Schenectady, N.Y.

[22] Filed: Dec. 8, 1975

[21] Appl. No.: 638,364

Related U.S. Application Data

[63] Continuation-in-part of Ser. No. 574,752, May 5, 1975, abandoned, Continuation-in-part of Ser. No. 520,451, Nov. 4, 1974, abandoned.

[52] U.S. Cl. .............................. 240/1.3; 174/68.5; 361/400
[51] Int. Cl.² ..................... G03B 15/02; H05K 1/00
[58] Field of Search ................. 240/1.3; 431/95; 174/68.5; 317/101 CC; 354/126, 127

[56] References Cited

UNITED STATES PATENTS

| 2,447,168 | 8/1948 | Dean et al. ............. 174/36 X |
| 2,502,291 | 3/1950 | Taylor ..................... 174/68.5 |
| 3,042,740 | 7/1962 | Bosworth ................ 174/68.5 |
| 3,229,623 | 1/1966 | Rubinstein et al. ...... 174/112 UX |
| 3,328,514 | 6/1967 | Cogelia .................... 174/112 X |
| 3,458,270 | 7/1969 | Ganser et al. ........... 240/1.3 X |
| 3,473,880 | 10/1969 | Wick ......................... 240/1.3 X |
| 3,608,451 | 9/1971 | Kelem ....................... 240/1.3 X |
| 3,619,589 | 11/1971 | Hartman ................... 240/1.3 |
| 3,619,590 | 11/1971 | Meulemans et al. ..... 240/1.3 |
| 3,710,704 | 1/1973 | Wagner .................... 240/1.3 X |
| 3,738,791 | 6/1973 | Cressman ................ 431/95 |
| 3,941,992 | 3/1976 | Blount et al. ............ 240/1.3 |

Primary Examiner—Fred L. Braun
Attorney, Agent, or Firm—Norman C. Fulmer; Lawrence R. Kempton; Frank L. Neuhauser

[57] ABSTRACT

A flash lamp array having a plurality of lamps positioned over a side of a circuit board having thereon circuitry for sequentially flashing the lamps. A metal shield, in the form of a sheet of metal foil or foil-covered paper, is positioned adjacent to the other side of the circuit board and is in contact with a common electrical run on the circuit board. Strips of radiation-sensitive plastic are positioned between the shield and the circuit board to function as electrical insulation, and also function as flash indicators by distorting due to radiation from an adjacent flashing lamp. Preferably, a conductive reflector member is positioned between the lamps and the circuit board and is connected to the common electrical circuit run.

22 Claims, 6 Drawing Figures

U.S. Patent April 19, 1977 4,019,043
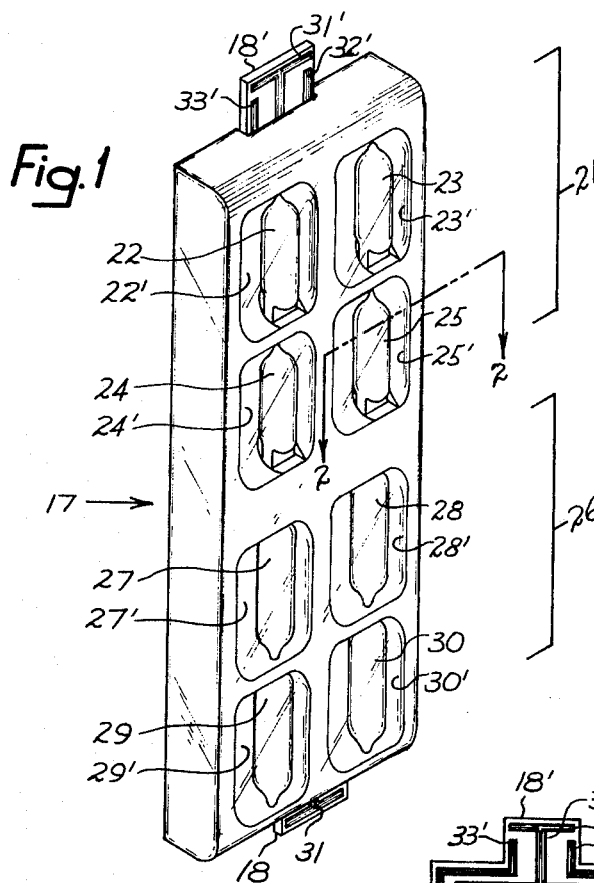
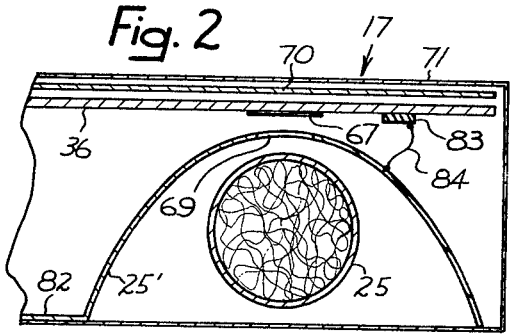
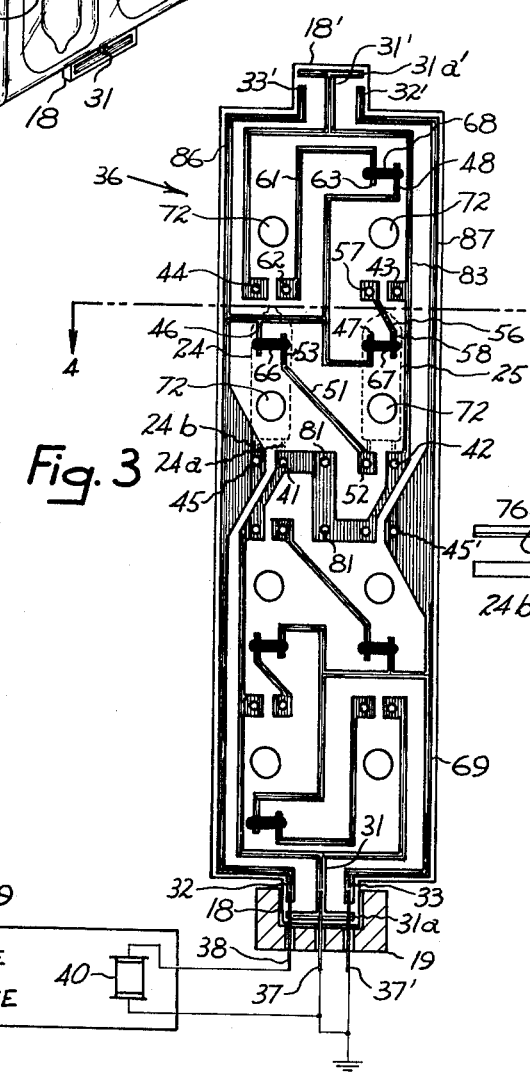
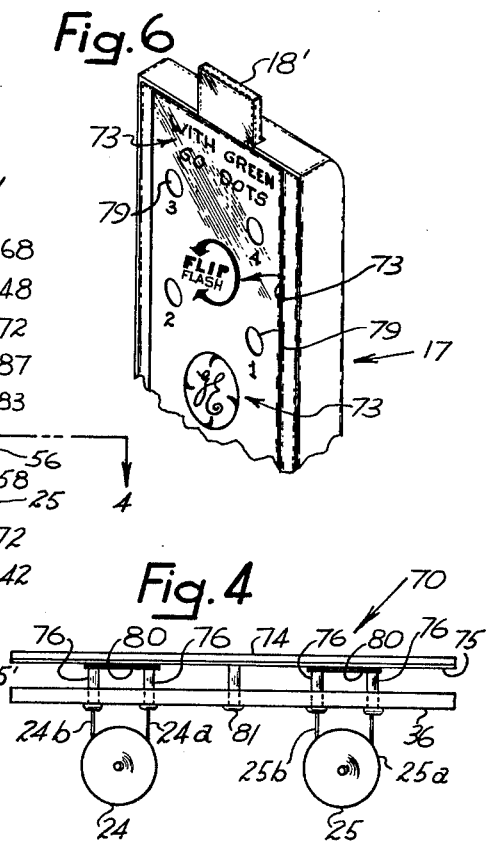

PHOTOFLASH LAMP ARRAY HAVING SHIELDED SWITCHING CIRCUIT

This is a continuation-in-part of application Ser. No. 574,752, filed May 5, 1975, abandoned, which is a continuation-in-part of application Ser. No. 520,451, filed Nov. 4, 1974, abandoned.

CROSS-REFERENCES TO RELATED APPLICATION

Ser. No. 448,671, filed Mar. 6, 1974, Kurt H. Weber, "Multiple Flash Lamp Unit", now Pat. No. 3,937,946, assigned the same as this invention.

Ser. No. 485,459, filed July 3, 1974, Richard Blount, "Multiple Flash Lamp Unit", now Pat. No. 3,952,320, assigned the same as this invention.

Ser. No. 485,422, filed July 3, 1974, Paul T. Cote, "Multiple Flash Lamp Unit", now Pat. No. 3,980,875, assigned the same as this invention.

Ser. No. 485,460, filed July 3, 1974, Paul T. Cote, "Protective Terminal for Multiple Flash Lamp Unit", now Pat. No. 3,980,876, assigned the same as this invention.

Ser. No. 499,316, filed Aug. 21, 1974, Paul T. Cote, "Connector for Photoflash Array", now Pat. No. 3,912,442, assigned the same as this invention.

Ser. No. 508,334, filed Sept. 23, 1974, now abandoned, Richard Blount, "Photoflash Array Construction", assigned the same as this invention.

Ser. No. 510,323, filed Sept. 30, 1974, now abandoned, Richard Blount, "Photoflash Lamp Array Having Radiation Switches and Flash Indicators", assigned the same as this invention.

Ser. No. 510,362, filed Sept. 30, 1974, Richard Blount, Paul T. Cote, and Edward C. Zukowski, "Flash Array Having Shielded Switching Circuit", now Pat. No. 3,941,992, assigned the same as this invention.

BACKGROUND OF THE INVENTION

The invention is in the field of multiple photoflash lamp units, such as planar arrays.

The above-referenced patent applications disclose multiple flash lamp units that can be connected to a camera in different orientations in each of which a different group of the flash lamps is relatively farther from the camera lens axis then are the other lamps of the unit. The lamps and electrical circuitry are arranged so that in any of the orientations of the unit with respect to the camera, only the group of lamps relatively farther from the lens axis can be flashed. The purpose of such an arrangement is to position the "active" group of flash lamps farther above the camera lens in order to reduce the possibility of a "red-eye" effect that causes the pupils of a person's eyes to appear red or pink in flash pictures taken when the flash lamp is close to the camera lens.

Each of the above-referenced multiple flash lamp arrays has, in a preferred embodiment, a circuit board having one or more integral plug-in connector tabs each provided with a plurality of electircal connection terminals in the form of conductive stripes printed on or otherwise attached to the connector tab. The various connector terminals are connected to individual lamps or to sequential firing circuitry carried on the circuit board and interconnected with lamps in the unit. Such flash units, and particularly if they employ high voltage types of flash lamps which are flashed by a high voltage pulse (1000 or 2000 volts, for example) of low energy, are prone to electrostatic firing of one or more lamps if a connection terminal is touched by or brought into close proximity to a person or object having an electrostatic charge. Such undesirable accidental flashing of lamps can also occur if the flash unit housing, which usually is made of a plastic material, acquires an electrostatic charge and a connector terminal is touched by or brought into close proximity to a person or object. The problem can also occur, and can be more severe, if both the plastic housing and the person or object near to or touching a connection terminal are electrostatically charged with relatively opposite polarities.

The first two of the above-referenced Cote patent applications disclose terminal circuit arrangements for reducing the likelihood of accidental flashing of lamps by electrostatic charge when the terminals are touched while handling the unit. This is accomplished by making one of the terminals longer or otherwise more readily touchable than the others, and by connecting this more touchable terminal electrically in the unit so as to have more stray capacitance to ground than the other terminals.

The above-referenced patent application of Blount, Cote, and Zukowski discloses a circuit shield in the form of a metal film or foil carried on the back side of the circuit board and electrically connected to the more readily touchable terminal of the circuit.

SUMMARY OF THE INVENTION

Objects of the invention are to provide an improved flash lamp array; to provide improved means for preventing accidental electrostatic flashing of lamps in such an array; and to provide such accidental flash prevention in combination with flash indicators in a manner that is feasible and economical to manufacture.

The invention comprises, briefly and in a preferred embodiment, a multiple flash lamp array which comprises a lamp flashing circuit in the form of a printed circuit on a surface of a circuit board. An electrically conductive sheet-like shield is provided adjacent and parallel to the other surface of the circuit board to reduce the possibility of accidental flashing of lamps by electrostatic voltage, which flashing tends to occur particularly when high voltage, low energy types of lamps are used in the array. Preferably, the shield is connected electrically to a lead-in wire of each lamp in the array, and also is connected electrically to a conductive reflector member positioned near the other side of the circuit board from the shield. A plurality of electrical terminals are provided on the array for connecting it to a socket of a camera or flash adapter, one of which terminals is shaped and arranged to be relatively more touchable than the others and is electrically connected to said shield, said lead-in wire of each lamp, and said reflector member, these members and connections constituting the common electrical portion of the circuit and having a relatively large stray capacitance to ground. By thus making one terminal more readily touchable and providing it with a relatively large stray capacitance to ground, an electrostatic charge applied to this terminal will be principally diverted through the larger stray capacitance to ground instead of passing through flash lamps in the array. Also, the shield on the one side and the conductive reflector on the other side of the circuit board shield the circuitry from electrostatic charges. The shield preferably is spaced from the rear side of the circuit board to reduce the capacitance between the shield and the non-common electrical portions of the circuit on the front side of the circuit board.

Preferably, the shield is a sheet of electrically conductive paper, plastic, or metal foil, or a sheet of conductively coated paper, which may also function as an indicia sheet by carrying indicia such as instructions, information, etc., on its back side. Preferably, the conductive part of the shield is in touching contact against a common electrical portion of the circuit board. Also, in the preferred embodiment, plastic flash indicator strips are associated with the shield and serve as electrical insulation to prevent the shield from shorting across the lamps.

BRIEF DESCRIPTION OF THE DRAWING

FIG. 1 is a perspective view of a multiple flash lamp array in accordance with a preferred embodiment of the invention.

FIG. 2 is a cross-sectional view of a portion of FIG. 1, taken on the line 2—2 thereof.

FIG. 3 is a front view of a circuit board to which flash lamps are connected in the multiple lamp array, shown plugged into a socket.

FIG. 4 is a cross-sectional view of the circuit board of FIG. 3, taken on the line 4—4 thereof, and also includes flash lamps, connecting eyelets, and a combination shield, indicia sheet, and flash indicator.

FIG. 6 is a perspective rear view of part of the flash array, showing indicia on the indicia sheet.

DESCRIPTION OF THE PREFERRED EMBODIMENT

Figure 5:
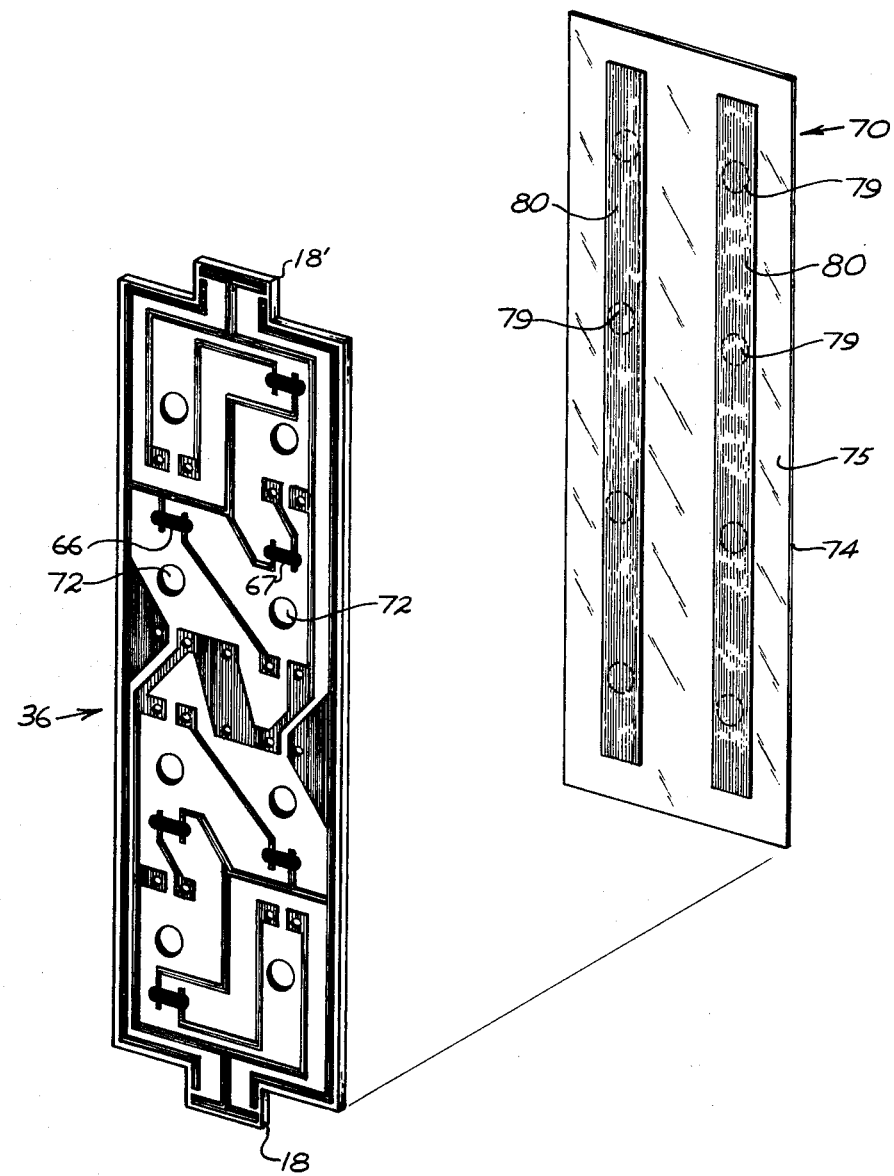
FIG. 5 is an exploded perspective view of the circuit board and the combination shield, indicia sheet, and flash indicator.

A multiple flash lamp array 17, shown as being of the planar array type and containing a plurality of electrically fired flash lamps, is provided with a plug-in connector tab 18 at the lower side or end thereof, adapted to fit into a socket 19 (FIG. 3) of a camera or flash adapter. The lamp array 17 is provided with a second plug-in connector tab 18' at the top side or end thereof, whereby the array 17 is adapted to be attached to the socket 19 in either of two orientations, i.e., with either the tab 18 or the tab 18' plugged into the socket 19. The array 17 is provided with an upper group 21 of flash lamps 22, 23, 24, and 25, and a lower group 26 of flash lamps 27, 28, 29, and 30. Reflectors 22', etc., are disposed behind the respective flash lamps so that as each lamp is flashed, its light is projected forwardly of the array 17. The relationship of each reflector to its associated lamp, and a suitable plastic housing and transparent front cover, may be as disclosed in the second above-referenced Blount patent application.

With the array 17 oriented and plugged into the socket 19 as shown in FIG. 3, only the upper four lamps of the array, which constitute the upper group 21, can be flashed, and the four lamps of the lower group 26 are inactive and will not flash. Thus, the above-described undesirable red-eye effect is reduced or eliminated, since the only lamps of the array that can flash are grouped relatively far from the socket 19 and hence from the axis of the camera's lens. The array 17 can be removed from the socket 19, either before or after all lamps of the upper group 21 have been flashed, and turned around, with the upper tab 18' now the lower tab which is inserted into the socket 19, whereupon the group 26 of lamps becomes the upper group, and its lamps are flashed, again reducing or eliminating the red-eye effect because the active lamps are relatively farthest from the socket 19 and hence from the axis of the camera's lens.

Electrical connector terminals are provided at the tabs 18 and 18', and if flash sequencing circuitry is included in the multiple flash unit, for instance as illustrated in FIG. 3, only two electrical terminals, which may be in the form of printed circuit stripes, need be provided on each tab for connecting the upper or active group of lamps to the socket 19. Thus, tab 18 is provided with a pair of electrical terminals 31 and 32, and the tab 18' is provided with a pair of terminals 31' and 32'. Each tab is provided with a third terminal 33 and 33', respectively, which functions in the camera to electrically short the circuitry of the inactive lower group of lamps, as will be described.

FIG. 3 shows a circuit board 36 for the embodiment of FIG. 1 which can be contained within the housing of the unit 17 behind the reflectors 22', etc., and which supports the flash lamps by their lead-in wires and provides for sequential firing of each group of lamps. The plug-in connector tabs 18 and 18' may be formed integrally with the circuit board 36 at opposite ends thereof, as shown. The top and bottom halves of the printed circuitry are reverse mirror images of each other.

The camera socket 19 for the flash unit 17 is provided with a pair of contacts 37 and 38 which respectively electrically engage the terminals 31 and 32 (or 31' and 32') of the flash unit when it is plugged into the socket 19. A third contact 37' is electrically connected to contact 37 and engages the third terminal 33 (or 33') of the circuit board.

A firing pulse source 39, which may be contained within a camera or flash adapter, is connected to the contacts 37 and 38 of the socket 19. The type of firing pulse produced by the source 39 and applied across the contacts 37 and 38 will of course depend on the type of lamps used in the flash unit 17. If low voltage filament types of flash lamps are employed in the unit 17, the firing pulse source 39 may be a battery or battery-capacitor discharge type, producing, in synchronization with opening of the camera shutter, a pulse of approximately 3 volts to 15 volts or more and of sufficient energy to fire a single flash lamp. An example of a low voltage flash lamp is disclosed in U.S. Pat. No. 3,506,385 to Kurt Weber and George Cressman, and an example of a low voltage flash sequencing circuit is disclosed in U.S. Pat. No. 3,532,931 to Paul Cote and John Harnden. If the flash lamps in the multiple flash unit 17 are of the so-called high voltage type, requiring a pulse of approximately 1000 or 2000 volts or more for example, the firing pulse source 39 may comprise a suitable battery-capacitor discharge and voltage step-up transformer type of circuit, or preferably may employ a compact piezoelectric element 40 arranged to be impacted or stressed in synchronization with opening of the camera shutter, so as to produce a firing pulse having a voltage of approximately 1000 or 2000 volts or more and of sufficient energy to fire a single flash lamp having a primer between its lead-in wires. An example of a high voltage flash lamp and a firing pulse source comprising a piezoelectric element synchronized with a camera shutter is described in U.S. Pat. Nos. 2,972,937 and 3,106,080 to C. G. Suits.

The center terminal 31 includes a portion 31a extending laterally across the tab between its end and the terminals 32 and 33, as is more fully disclosed in the above-referenced Cote patent application Ser. No. 485,460. The portion 31a functions to reduce the possibility of lamps being flashed by electrostatic charge when the tab 18 is grasped by a person or comes into contact with another object and also functions, when the tab 18 is being plugged into the socket 19, to temporarily short out and discharge any residual voltage of the firing pulse source 39. Similarly, the terminal 31' includes a lateral portion 31a'.

The circuit board 36 in FIG. 3 is shown in the orientation in which the connector tab 18 faces downwardly and is plugged into the socket 19, whereby the circuit board terminals 31, 32, and 33 respectively make electrical contact with the socket contacts 37, 38, and 37'. The contact 38 is shaped so as not to contact the lateral terminal portion 31a when the array is fully plugged into the socket. The circuit board terminal 31 is part of a continuous conductor run on the board, which is connected in common to one electrical lead wire or conductor (22a, 23a, 24a, etc.) of each of the eight flash lamps 22, 23, 24, etc., in the unit at points 41, 42, 43, 44, etc., by suitable means such as soldering, welding, or crimping. For the sake of clarity, only two flash lamps 24 and 25 are shown in FIG. 3, and in dashed lines. Suitable openings are provided through the reflectors at the bases of the lamps to permit the connections of the lead-in wires to the circuit board.

The circuit board terminal 32 is part of a conductor run that is connected to lead-in wire 24b of lamp 24 at point 45, and terminates at radiation switch terminals 46, 47, and 48 respectively positioned near lamps 24, 25, and 23. A circuit board conductor run 51 is connected to the remaining lead wire of flash lamp 25 at 52, and terminates at a radiation switch terminal 53 which is near to but spaced from radiation switch terminal 46. A circuit board conductor run 56 is connected to the remaining lead-in wire of flash lamp 23 at point 57, and terminates at a radiation switch terminal 58 which is near to but spaced from radiation switch terminal 47. Similarly, a circuit board conductor run 61 is connected to the remaining lead-in wire of flash lamp 22 at point 62, and terminates at a radiation switch terminal 63 which is near to but spaced from the radiation switch terminal 48.

Radiation switches 66, 67, and 68 are respectively positioned to be in contact with and bridge across the respective pairs of switch terminals 46-53, 47-58, and 48-63. The material for the radiation switches 66, 67, and 68 may be suitable material initially having an open circuit or high resistance, the resistance thereof becoming zero or a low value when the material receives radiation in the form of head and/or light from a respective adjacent lamp, upon the lamp being flashed. For this purpose, each of the radiation switches 66, 67, and 68 is respectively positioned behind and near to a flash lamp 24, 25, 23. Window means in the form of transparent sections or openings 69 may be provided in the reflectors in front of the switches as shown in FIG. 2 to facilitate radiation transfer. A suitable material for the radiation switches 66-68 is silver oxide dispersed in a binder such as polyvinyl resin. Each of these radiation switches, upon receiving radiation from the adjacent lamp when it is flashed, changes from an open circuit or high resistance to a closed circuit or low resistance between its switch terminals on the circuit board.

The terminal 33 on the plug-in tab 18 is connected, via a printed circuit run 69', to the connection point 45' for lamp 28, which is the first lamp to be flashed when the array is turned around so that terminals 31' and 32' are connected to the firing pulse source 39 via the socket 19. Since the socket contacts 37 and 37' are electrically shorted together, they electrically short together the tab terminals 31 and 33, also at the same time shorting terminals 31' and 32' of the inactive lower group of lamps, thus electrically shorting the input of the circuitry for the inactive group of lamps. Similarly when the unit is turned around, the socket contacts 37 and 37' will electrically short the terminals 31' and 33' and also terminals 31 and 32, thus shorting the input of the then inactive lamp circuit. This shorting of the inactive lamp circuit prevents accidental flashing of an inactive lamp by stray capacitive coupling of a firing pulse, as is described in detail in the first above-referenced Blount patent application. Of course, this precaution is useful only when the inactive lamps have not yet been flashed, and is not necessary if they have already been flashed.

As has been explained, the lower portion of the circuit board contains a substantially reverse mirror image of the same circuit shown in the upper part of the circuit board, and therefore will not be described in detail. It will be noted that the circuit runs from the plugged-in terminals 31 and 32 at the lower part of the circuit board extend upwardly so as to activate the circuitry in the upper half of the circuit board. Similarly, when the unit is turned around and tab 18' is plugged into the socket 16, the circuit board terminals 31' and 32' will be connected to and activate the lamps which then will be in the upper half of the circuit board, and hence in the upper half of the flash unit 17. This accomplishes, as has been stated, the desirable characteristic whereby only the group of lamps relatively farthest away from the lens axis will be flashed, thereby reducing or eliminating the undesirable red-eye effect.

The circuit of FIG. 3 functions as follows. Assuming that none of the four lamps in the upper half of the unit 17 have been flashed, upon occurrence of a first firing pulse from the source 39, this pulse will be directly applied to the lead-in wires of the first-connected flash lamp 24, whereupon the lamp 24 flashes and becomes an open circuit between its lead-in wires. Heat and light radiation from the flashing first lamp 24 causes the adjacent radiation switch 66 to become a closed circuit between terminals 46 and 53 (or a low value of resistance), thereby connecting the circuit board terminal 32 electrically to the lead-in wire of the second lamp 25 at point 52. By the time this occurs, the firing pulse had diminished to a value insufficient to cause the second lamp 25 to flash. When the next firing pulse occurs, it is applied to the lead-in wires of the second lamp 25, via the now closed radiation switch 66, whereupon the second lamp 25 flashes, thereby causing radiation switch 67 to assume zero or low resistance, and the second lamp 25 now has an open circuit or high resistance between its lead-in wires. When the next firing pulse occurs, it is applied via now closed radiation switch 67 to the third lamp 23 via its lead-in wires which are connected to the printed circuit at points 43 and 57, thereby firing the lamp which becomes an open circuit, and the radiation from it causes the radiation switch 68 to become essentially a closed circuit across its terminals. Thus, the next firing pulse will be applied, via now closed radiation switch 68, to the lead-in wires of the fourth flash lamp 22 which are connected to the circuit at points 44 and 62, thereupon causing the lamp to flash. Since this lamp is the last lamp in the active circuit, it does not matter whether its lead-in wires are an open or closed circuit after flashing. Additional flash lamps, radiation switches, and electrical conductors can be employed, if desired, using the just described principles. When the flash unit is turned around and the other connector tab 18' attached to the socket 19, the group of lamps that then become uppermost and relatively farthest away from the lens axis will be in an active circuit and will be flashed in the same manner as has been described.

In accordance with the invention, an electrically conductive sheet 70 is positioned behind the circuit board 36, and is sandwiched between the circuit board and the back part 71 of the housing for the array. The conductive sheet 70 is electrically connected to the common electrical circuit run on the circuit board, i.e., to the circuit run 83 which constitutes the terminals 31 and 31' and which is connected to a lead-in wire 22a, etc., of each of the flash lamps. As will be explained subsequently, the sheet 70 causes the common electrical circuit run to have greater stray capacitance to ground and also functions as an electrical shield. Preferably, the shield 70 is about the same height and width as the interior height and width of the array 17, and may be a conductive foil such as aluminum. Preferably, and further in accordance with the invention, the shield 70 is combined with flash indicators which receive radiation through window means which may be in the form of openings 72 in the circuit board respectively behind each lamp. Like the window means 69 in the reflectors, the window means 72 in the reflectors and circuit board in front of the flash indicators may be either transparent sections, or openings, or a combination thereof. The circuit board 36 can be of transparent plastic so as to provide the window means. "Transparent" is intended to mean that the window means are sufficiently transparent to radiation of flashing lamps so that sufficient radiation will pass therethrough to actuate the switches and/or flash indicators. Openings are the preferred form of the window means, so as to insure the transmission of sufficient radiation from flashing lamps to actuate any relatively less sensitive switches and flash indicators. The shield 70 may also function as an indicia sheet by having indicia 73 in the form of information, instructions, etc., on its back surface and visible through the back 71 of the array which should be transparent or provided with openings over the indicia. As shown in FIG. 4, the shield 70 may comprise a sheet 74 of paper coated with a layer 75 of metal.

In a preferred construction, shown in FIGS. 4 and 5, eyelets 76 are positioned through openings in the circuit board 36 at the points 41, 42, etc., where the lamp lead-in wires 22a, 22b, etc., are to be attached. The heads of the eyelets 76 are in contact with circuit runs on the board, and the other ends of the eyelets project slightly from the back of the board and are soldered or crimped to the lead-in wires, thus attaching the lamps electrically and mechanically to the circuit board.

The combination shield, flash indicator, and indicia sheet 70 is provided with openings 79 respectively behind and in alignment with the openings 72 in the circuit board 36. Strips 80 of radiation-sensitive plastic, such as biaxially oriented polypropylene, are glued or otherwise attached to the metal foil 75, and cover the openings 79 and are visible through the openings 79 from the rear of the array. The plastic 80 shrinks or melts when subjected to radiant energy from an adjacent flashing lamp thus effectively changing the appearance or color at its opening 79 and indicating that the lamp has been flashed. Preferably, the openings 69 through the reflectors in alignment with the switches 67, etc., are large enough to overlie the openings 72 through the circuit board 36, or additional openings are provided through the reflectors in alignment with the circuit board openings 72, to facilitate radiation transfer from a flashing lamp to the flash indicator material 80 at the opening 79 behind the lamp. In a preferred embodiment, the flash indicator material is colored (green, for example) by ink or other suitable means on its back side which is visible through the openings 79 and the transparent back 74 of the array. The color disappears and the opening becomes a different color (dark, for example) when the plastic shrinks or melts away, or becomes charred, at the opening due to radiation from the adjacent flashing lamp. The front of the plastic (toward the lamps) should be coated with dark ink so as to absorb heat and light radiation more readily.

The terms "radiant energy" and "radiation", as used herein, denote energy in the form of light and heat radiated from a flashing lamp. This includes a combination of heat alone, light alone, and light accompanied by heat. The switches 67, etc., and the flash indicator material 80 are activated by a combination of heat radiated by a flashing lamp and heat generated internally of the switch and flash indicator by the intense light impinging thereon.

As shown in FIG. 4, one or more concuctor members such as eyelets 81 are positioned through openings in the circuit board at a portion of the common electrical circuit run 83, with their heads in contact with the common electrical circuit run and their other ends touching the metal foil 75 so that the foil is connected electrically to the common circuit run and functions as a shield to reduce the possibility of undesired accidental flashing of lamps by electrostatic voltage charges. The plastic indicator strips 80 serve as electrical insulation to prevent shorting across the lamp connection eyelets 76 by the metal foil 75. A convenient way of achieving this is to position the plastic strips 80 vertically behind the two columns of lamps, as shown, so as to be behind all of the lamp lead-in connector eyelets 76.

The "T-bar" terminals 31 and 31', both being connected to a lead-in wire of each of the flash lamps in the unit, will have a relatively greater value of stray capacitance to ground than the other terminals 32, 33, etc. When these more readily touchable terminals are touched by an electrostatically charged person or object, substantially all of the charge energy will be dissipated to ground through the relatively larger capacitance of the common connection circuit rather than passing through the primers of lamps and hence through the relatively smaller capacitance of the remaining circuitry to ground. If the charged person or object touched only the terminal 32 (or 33') or only the terminal 33 (or 32'), the dissipative flow would tend to pass through one or more of the lamp primers, creating a spurious electrostatic firing of the lamp or lamps. But since the common connector terminal (i.e., the terminal 31 or 31') is substantially always touched alone or simultaneously with one of the terminals 32, 33, 32' or 33', the electrostatic charge will pass to ground through the relatively larger capacitance of the common connection circuit without tending to flow through a lamp primer.

Simultaneous touching of the terminal 31 or 31' and one or both of the remaining terminals cannot cause electrostatic flashing because the same voltage is applied to both lead-in wires of the lamps. Usually, if the electrostatic charge is great enough to be likely to flash a lamp, contact will be in the form of a spark between the common terminal 31 or 31' and the electrostaticlly charged finger or object.

To increase the stray capacitance to ground of the common connection circuit, and therefore further reduce the likelihood of accidental electrostatic firing of lamps, a large-area shield member 82 is connected to the common connection circuit. An advantageous way of achieving this is to provide a one-piece multiple reflector unit, of substantially the same size as the flash unit 17, shaped to provide the individual reflector 22', 23', etc., and made of metal or plastic metallized on one or both surfaces and connected electrically to the electrical common connection circuit 83 by means such as a wire 84 (FIG. 2), as described in the first and second above-referenced Cote patent applications.

The shield 70 of this invention should be shaped and arranged to be behind the back of the circuit board 36 at least over a substantial portion of the areas corresponding to where the non-common or "hot" circuit runs 86, 87 are located on the board, the term "hot" being used in the electrical sense to denote circuit runs other than the common electrical circuit run 83. The shield 70 preferably covers substantially the entire back surface of the board.

The shield 70 achieves beneficial results of reducing the possibility of accidental lamp flashing in at least two ways. First, it shields the relatively "hot" circuit runs 86, 87, which are close to the back 71 of the array and separated therefrom only by the thickness of the circuit board 36 plus perhaps a small air space, and reduces the likelihood of these "hot" circuit runs from picking up a capacitively induced electrostatic voltage charge from the back 71 of the array housing, which voltage charge can be caused when the array is handled or contacts a charged object, especially if the housing is made of plastic. Secondly, the shield helps to reduce the possibility of accidental electrostatic flashing of the lamps when the terminal 31 or 31' is touched when handling the array, because it is connected to the common circuit run 83 and increases the capacitance to ground of the common electrical circuit in the same manner as described above in connection with reflector shield member 82 which also is connected to the common circuit run. With the shield 70, the conductive reflector 82 and the common circuit run 83 all being electrically common to the terminals 31 and 31', the improvement is enhanced since the possibility of spurious electrostatic flashing is reduced.

Another feature of the invention is the spacing of the shield 70 from the back of the circuit board 36, such as is shown in FIG. 4. For economy and feasibility of manufacturing, the circuit board preferably is thin, for example, about 1/20 inch in thickness. If the shield 70 is positioned against or near to the back of a thin circuit board, the capacitance between the shield and the "hot" circuit runs 86, etc., on the front of the board may be great enough to electrically load the pulse generator 40, so that the firing pulse voltage might be insufficient to reliably flash a lamp. This capacitance increases as the lamps become successively flashed, and thus each successive lamp receives a lower value of firing voltage than did the preceding lamps. A convenient way of spacing the shield 70 from the back of the circuit board 36 and thus reducing the capacitance between it and the "hot" circuit runs on the front of the circuit board is by means of the eyelets 76 and 81 as shown in FIG. 4 and described above.

It has been found that the invention achieves its objectives of reducing the likelihood of accidental electrostatic flashing of lamps in a multiple lamp flash unit, and of providing a combination shield, flash indicator, and indicia sheet that is feasible and economical to manufacture.

While preferred embodiments of the invention have been shown and described, various other embodiments and modifications thereof will become apparent to persons skilled in the art, and will fall within the scope of the invention as defined in the following claims.

What I claim as new and desire to secure by Letters Patent of the U.S. is:

1. A multiple flash lamp array comprising a plurality of flash lamps of the electrically fired type, a circuit board having circuitry on one side thereof for sequentially firing said lamps, and means electrically connecting said lamps to said circuitry, wherein the improvement in said array comprises an electrically conductive shield in the form of a conductive sheet member connected electrically to said sequential firing circuitry and positioned substantially parallel to and spaced from at least part of the opposite side of said circuit board to reduce the likelihood of said lamps being fired by electrostatic charges applied to said array and to reduce capacitive coupling between said shield and said firing circuitry.

2. An array as claimed in claim 1, in which a side of said shield faces away from said circuit board and is provided with indicia visible from the exterior of said array.

3. An array as claimed in claim 1, in which said conductive sheet member comprises a paper sheet covered with metal.

4. An array as claimed in claim 3, in which said conductive sheet member is positioned with the paper sheet facing away from said circuit board, the exposed side of said paper sheet being provided with indicia visible from the exterior of said array.

5. An array as claimed in claim 1, in which said circuitry includes a circuit run on said one side of said board, and said array further including a conductive member in electrical contact with said circuit run and extending through said board into electrical contact with said shield.

6. An array as claimed in claim 5, in which said conductive member extends from said circuit board and serves to space said shield from said circuit board.

7. An array as claimed in claim 1, in which each of said flash lamps is positioned adjacent to a front side of said circuit board and said shield is positioned adjacent to the back side of said circuit board, said circuit board and shield being provided with a plurality of window means aligned respectively behind said lamps, and said shield including flash indicator means positioned behind each of said lamps in alignment with said window means and visible from the exterior of said array.

8. An array as claimed in claim 7, in which said window means comprise openings.

9. An array as claimed in claim 7, in which said shield is provided with indicia on a surface thereof and visible from the exterior of said array.

10. An array as claimed in claim 7, in which said flash indicator means is joined to said shield and comprises radiation-deformable plastic which deforms in response to the flashing of an adjacent lamp.

11. An array as claimed in claim 10, in which said flash indicator means comprises at least one sheet of said radiation-deformable plastic positioned between said shield and said circuit board and extending over a plurality of said window means in the shield and providing electrical insulation between said shield and said circuit board.

12. An array as claimed in claim 11, in which said lamps are arranged in first and second parallel columns with respect to said circuit board, in which said means electrically connecting said lamps to said circuitry comprises conductive members extending through said circuit board and having portions exposed at the back of the circuit board substantially in alignment with said first and second columns, said window means in said shield and circuit board being arranged in first and second rows which are substantially in alignment with said first and second columns, said flash indicator means comprising first and second strips of radiation-deformable plastic positioned between said shield and said circuit board respectively substantially in alignment with said first and second columns and respectively extending over said first and second rows of window means so as to provide electrical insulation between said shield and the portions of said conductive members that are exposed at the back of the circuit board.

13. An array as claimed in claim 12, including means exposing a point of said circuitry at said back of the circuit board at a position between said first and second columns, said shield being in touching contact with said exposed circuitry point.

14. An array as claimed in claim 13, in which said shield is provided with indicia on a surface thereof and visible from the exterior of said array.

15. An array as claimed in claim 14, in which said shield comprises a sheet of paper provided with a metal coating thereon, said coating facing said circuit board, and said indicia being provided on the exposed side of said sheet of paper.

16. A multiple flash lamp array comprising a circuit board, a plurality of flash lamps of the electrically fired type and each having first and second lead-in conductors, first and second circuit runs on one side of said circuit board, means for electrically connecting said first circuit run in common to the first lead-in conductors of all of said lamps and for electrically connecting said second circuit run to the second lead-in conductor of each of a lesser number of lamps whereby said first circuit run has a larger stray capacitance to ground than said second circuit run, an electrically conductive shield located in substantially parallel face-to-face relation with at least part of the opposite side of said circuit board and electrically connected to said first circuit run thereby to increase further the stray capacitance to ground of said first circuit run and to reduce the likelihood of said lamps being fired by electrostatic charges applied to said array, wherein the improvement in said array comprises means for keeping said shield in spaced relation from said opposite side of said circuit board thereby to reduce the capacitive coupling between said shield and said second circuit run.

17. An array as claimed in claim 16, in which said last-mentioned means comprises at least one electrically conductive member connected electrically to said first circuit run and extending through said circuit board into electrical contact with said shield.

18. An array as claimed in claim 17, in which said shield comprises a layer of conductive material, and a layer of flash indicating material joined to said conductive material and capable of changing appearance in response to the transmission of radiation from said lamps when the latter are flashed.

19. An array as defined in claim 18, in which said flash indicating material is substantially electrically non-conductive, said last-mentioned means further comprising electrically conductive members connected electrically to said second lead-in conductors of said lamps and disposed in electrical contact with said second circuit run, said last-mentioned conductive members extending through said circuit board, being disposed in contact with said flash indicating material, and being electrically insulated from said conductive material by said flash indicating material.

20. A multiple flash lamp array comprising a housing with front and back members which are transparent at least in part, a circuit board within said housing and having circuitry on the front side thereof, a plurality of flash lamps of the electrically fired type disposed within said housing on the front side of said circuit board, and means electrically connecting said lamps to said circuitry, wherein the improvement in said array comprises, a sheet disposed within said housing between the back side of said circuit board and the back member of said housing and disposed face-to-face with the back side of said circuit board, said sheet comprising a layer of electrically conductive material forming a shield for said circuitry, and said sheet further comprising a layer of flash-indicating material which is joined to said conductive material and which changes appearance in response to the transmission of radiation from said lamps when the latter are flashed.

21. An array as claimed in claim 20, further including a layer of paper joined to the rear face of said layer of conductive material, and indicia printed on the rear face of said layer of paper and visible through the back member of said housing.

22. An array as claimed in claim 20, in which said sheet is spaced rearwardly from the back side of said circuit board to reduce the capacitive coupling between said conductive material and a portion of said circuitry.

* * * * *